United States Patent
Hu et al.

(10) Patent No.: US 9,105,647 B2
(45) Date of Patent: Aug. 11, 2015

(54) METHOD OF FORMING PERFORATED OPENING IN BOTTOM SUBSTRATE OF FLIPCHIP POP ASSEMBLY TO REDUCE BLEEDING OF UNDERFILL MATERIAL

(75) Inventors: Junwei Hu, Shanghai (CN); JaeHak Yee, Qinpu District (CN); Lin Tan, Shanghai (CN); Wenbin Qu, Shanghai (CN); YuFeng Feng, Shanghai (CN)

(73) Assignee: STATS ChipPAC, Ltd., Singapore (SG)

( * ) Notice: Subject to any disclaimer, the term of this patent is extended or adjusted under 35 U.S.C. 154(b) by 379 days.

(21) Appl. No.: 12/781,754

(22) Filed: May 17, 2010

(65) Prior Publication Data

US 2011/0278712 A1    Nov. 17, 2011

(51) Int. Cl.
*H01L 21/00*    (2006.01)
*H01L 21/56*    (2006.01)
(Continued)

(52) U.S. Cl.
CPC .............. *H01L 21/563* (2013.01); *H01L 24/73* (2013.01); *H01L 25/0657* (2013.01); *H01L 25/105* (2013.01); *H01L 25/50* (2013.01); *H01L 23/13* (2013.01); *H01L 23/3128* (2013.01); *H01L 23/49827* (2013.01); *H01L 24/16* (2013.01); *H01L 24/30* (2013.01); *H01L 24/33* (2013.01); *H01L 24/48* (2013.01); *H01L 24/81* (2013.01); *H01L 2224/16225* (2013.01); *H01L 2224/16227* (2013.01); *H01L 2224/29007* (2013.01); *H01L 2224/32145* (2013.01); *H01L 2224/32225* (2013.01); *H01L 2224/48091* (2013.01); *H01L 2224/48227* (2013.01); *H01L 2224/73203* (2013.01); *H01L 2224/73204* (2013.01); *H01L 2224/73253* (2013.01); *H01L 2224/73265* (2013.01); *H01L 2224/92247* (2013.01);

(Continued)

(58) Field of Classification Search
None
See application file for complete search history.

(56) References Cited

U.S. PATENT DOCUMENTS 6,404,062 B1    6/2002    Taniguchi et al.
7,485,502 B2 *  2/2009    Jeon et al. ..................... 438/127

(Continued)

FOREIGN PATENT DOCUMENTS

CN    101179068 A    5/2008
CN    101432876 A    5/2009

OTHER PUBLICATIONS

Definition of over. (n.d.) The American Heritage® Dictionary of the English Language, Fourth Edition. (2003). Retrieved Jun. 1, 2014 from http://www.thefreedictionary.com/over.*

*Primary Examiner* — Michael Jung
(74) *Attorney, Agent, or Firm* — Robert D. Atkins; Patent Law Group: Atkins and Associates, P.C.

(57) ABSTRACT

A semiconductor device has a flipchip semiconductor die mounted to a first substrate using a plurality of first bumps. An opening or plurality of openings is formed in the first substrate in a location central to placement of the flipchip semiconductor die to the first substrate. A plurality of semiconductor die is mounted to a second substrate. The semiconductor die are electrically connected with bond wires. An encapsulant is over the plurality of semiconductor die and second substrate. The second substrate is mounted to the first substrate with a plurality of second bumps. An underfill material is dispensed through the opening in the first substrate between the flipchip semiconductor die and first substrate. The dispensing of the underfill material is discontinued as the underfill material approaches or reaches a perimeter of the flipchip semiconductor die to reduce bleeding of the underfill material. The underfill material is cured.

14 Claims, 13 Drawing Sheets

(51) Int. Cl.
*H01L 25/065* (2006.01)
*H01L 25/10* (2006.01)
*H01L 25/00* (2006.01)
*H01L 23/02* (2006.01)
*H01L 23/34* (2006.01)
*H01L 23/28* (2006.01)
*H01L 23/13* (2006.01)
*H01L 23/31* (2006.01)
*H01L 23/498* (2006.01)
*H01L 23/00* (2006.01)

(52) U.S. Cl.
CPC .......... *H01L2225/0651* (2013.01); *H01L 2225/06562* (2013.01); *H01L 2225/1023* (2013.01); *H01L 2225/1058* (2013.01); *H01L 2924/014* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/15331* (2013.01); *H01L 2924/19041* (2013.01); *H01L 2924/19042* (2013.01); *H01L 2924/19043* (2013.01)

(56) References Cited

U.S. PATENT DOCUMENTS

| | | | |
|---|---|---|---|
| 8,193,624 B1 * | 6/2012 | Sohn | 257/686 |
| RE44,629 E * | 12/2013 | Ramalingam et al. | 29/852 |
| 2003/0113952 A1 * | 6/2003 | Sambasivam et al. | 438/108 |
| 2007/0176285 A1 | 8/2007 | Jeon et al. | |
| 2007/0224729 A1 * | 9/2007 | Reiss et al. | 438/106 |
| 2008/0111224 A1 | 5/2008 | Byun et al. | |
| 2008/0157330 A1 * | 7/2008 | Kroehnert et al. | 257/686 |
| 2009/0020885 A1 * | 1/2009 | Onodera | 257/777 |
| 2009/0079069 A1 * | 3/2009 | Jang et al. | 257/737 |
| 2009/0243065 A1 | 10/2009 | Sugino et al. | |
| 2009/0243072 A1 * | 10/2009 | Ha et al. | 257/686 |
| 2011/0210436 A1 | 9/2011 | Chow et al. | |

* cited by examiner

METHOD OF FORMING PERFORATED OPENING IN BOTTOM SUBSTRATE OF FLIPCHIP POP ASSEMBLY TO REDUCE BLEEDING OF UNDERFILL MATERIAL

FIELD OF THE INVENTION

The present invention relates in general to semiconductor devices and, more particularly, to a semiconductor device and method of forming a perforated opening in the bottom substrate of a flipchip PoP assembly to reduce bleeding of excess underfill material.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Figure 1:
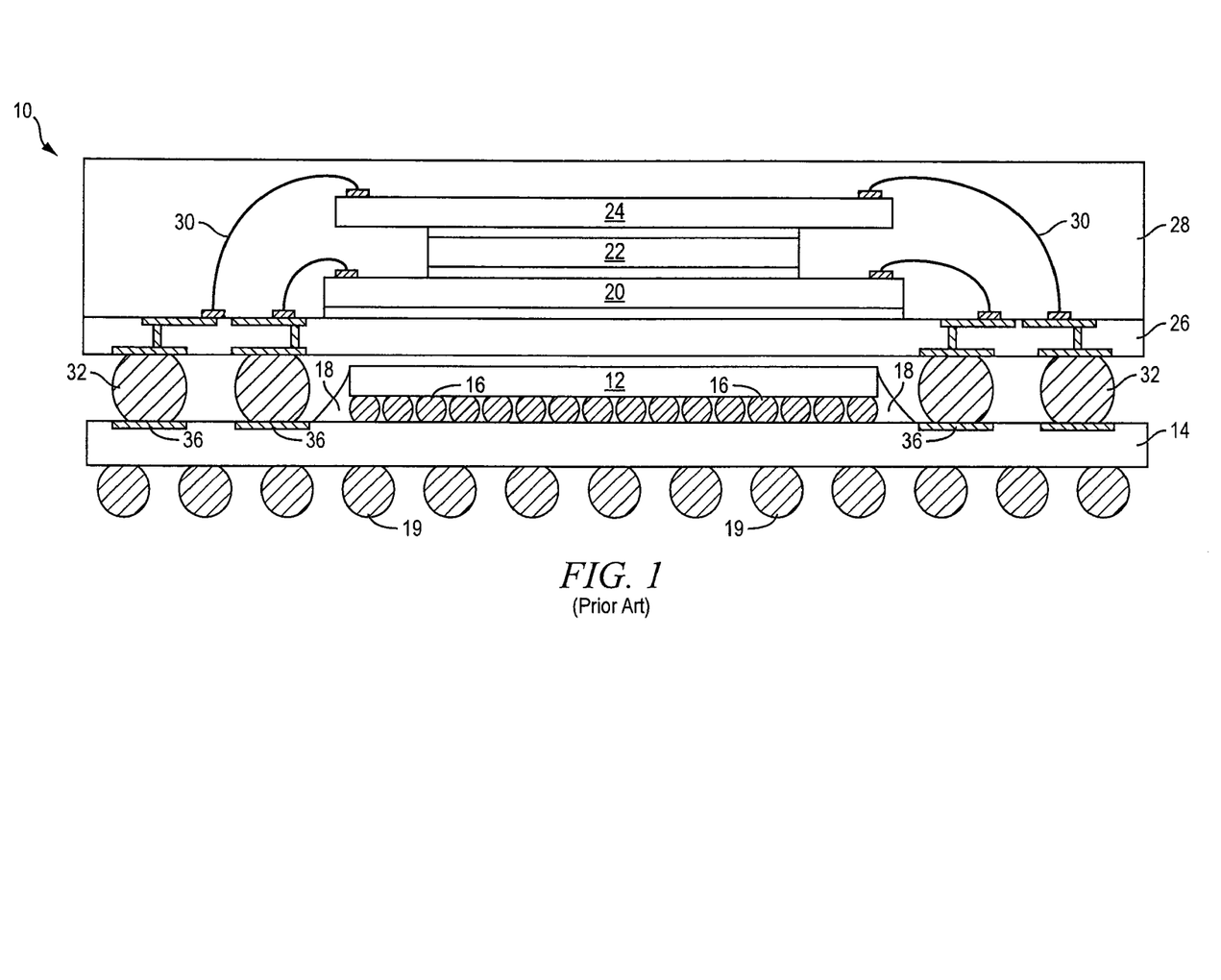
FIG. 1 illustrates a conventional flipchip semiconductor die PoP structure.

FIG. 1 shows a conventional flipchip package-on-package (PoP) structure 10. A flipchip type semiconductor die 12 is mounted to substrate 14 with bumps 16. An underfill material 18, such as epoxy resin, is deposited between semiconductor die 12 and substrate 14. Bumps 19 are formed on the opposite side of substrate 14 for further electrical interconnect. Semiconductor die 20, 22, and 24 are stacked over substrate 26 and covered by encapsulant 28. Semiconductor die 20-24 are electrically connected to substrate 26 with bond wires 30. Substrate 26 is connected to substrate 14 with bumps 32.

Figure 2A:
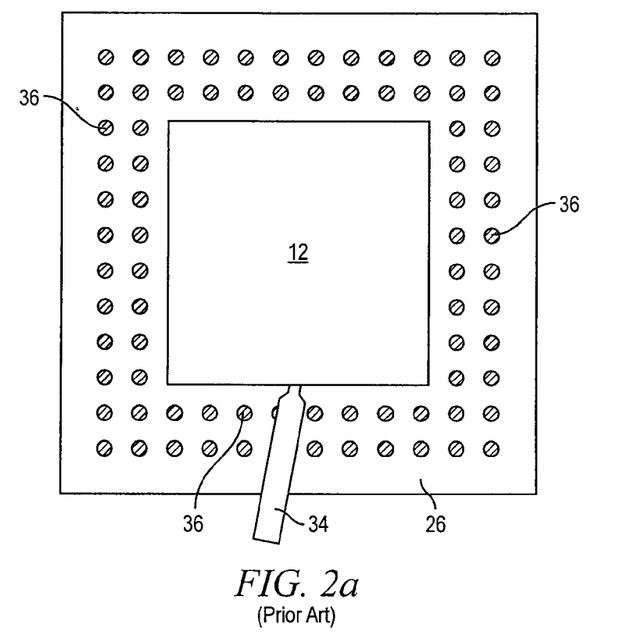
FIGS. 2a-2b show the bleed-out of underfill material from uneven or excessive volume dispensing which causes defects.
Figure 2B:
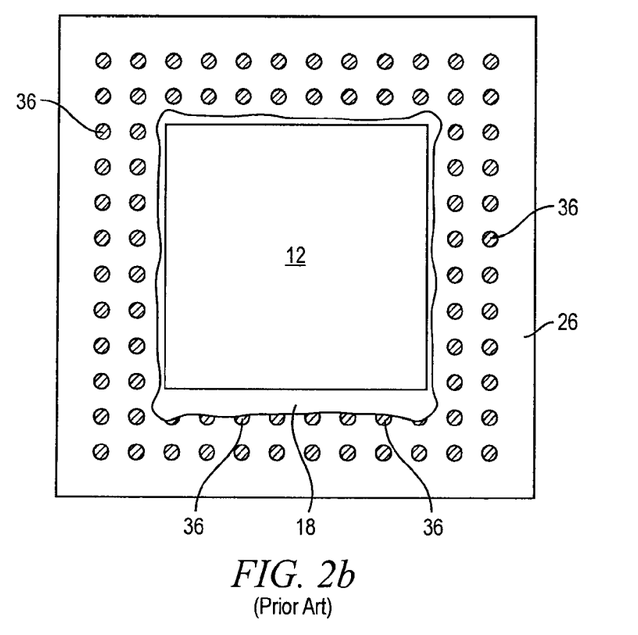

The underfill material 18 is deposited from a side of semiconductor die 12 using dispensing tool 34, as shown in FIG. 2a. If underfill material 18 is not evenly and uniformly distributed, or if the underfill material is dispensed with excess volume, then the underfill material can bleed onto contact pads 36 of substrate 26, as shown in FIG. 2b. The underfill bleed-out is particular acute for semiconductor devices with high input/output (I/O) density as the contact pads are typically placed closer to the footprint of semiconductor die 12. The bleeding of excess underfill material 18 over contact pads 36 prevents electrical connection of bumps 32 to the contact pads on substrate 14, which causes defects and reduces manufacturing yield.

SUMMARY OF THE INVENTION

A need exists to reduce bleeding of excess underfill material from under the semiconductor die onto contact pads of the substrate. Accordingly, in one embodiment, the present invention is a method of making a semiconductor device comprising the steps of providing a flipchip semiconductor die and first substrate, forming an opening in the first substrate in a location central to placement of the flipchip semiconductor die to the first substrate, mounting the flipchip semiconductor die to the first substrate over the opening in the first substrate, mounting a plurality of semiconductor die to a second substrate, depositing an encapsulant over the plurality of semiconductor die and second substrate, mounting the second substrate to the first substrate, dispensing underfill material through the opening in the first substrate between the flipchip semiconductor die and first substrate, and discontinuing dispensing of the underfill material as the underfill material approaches or reaches a perimeter of the flipchip semiconductor die to reduce bleeding of the underfill material.

In another embodiment, the present invention is a method of making a semiconductor device comprising the steps of providing a first semiconductor die and first substrate, forming an opening in the first substrate, mounting the first semiconductor die to the first substrate over the opening in the first substrate, mounting a plurality of second semiconductor die to a second substrate, mounting the second substrate to the first substrate, dispensing underfill material through the opening in the first substrate between the first semiconductor die and first substrate, and discontinuing dispensing of the underfill material as the underfill material approaches or reaches a perimeter of the flipchip semiconductor die.

In another embodiment, the present invention is a method of making a semiconductor device comprising the steps of providing a semiconductor die and substrate, forming an opening in the first substrate, mounting the first semiconductor die to the first substrate over the opening in the first substrate, providing a PoP semiconductor assembly, mounting the PoP semiconductor assembly to the substrate over the semiconductor die, and dispensing underfill material through the opening in the substrate between the semiconductor die and substrate.

In another embodiment, the present invention is a semiconductor device comprising a substrate having an opening. A semiconductor die is mounted to the substrate with the opening in the substrate located central to placement of the semiconductor die to the substrate. A PoP semiconductor assembly is mounted to the substrate over the semiconductor die. An underfill material is dispensed through the opening in the substrate between the semiconductor die and substrate.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
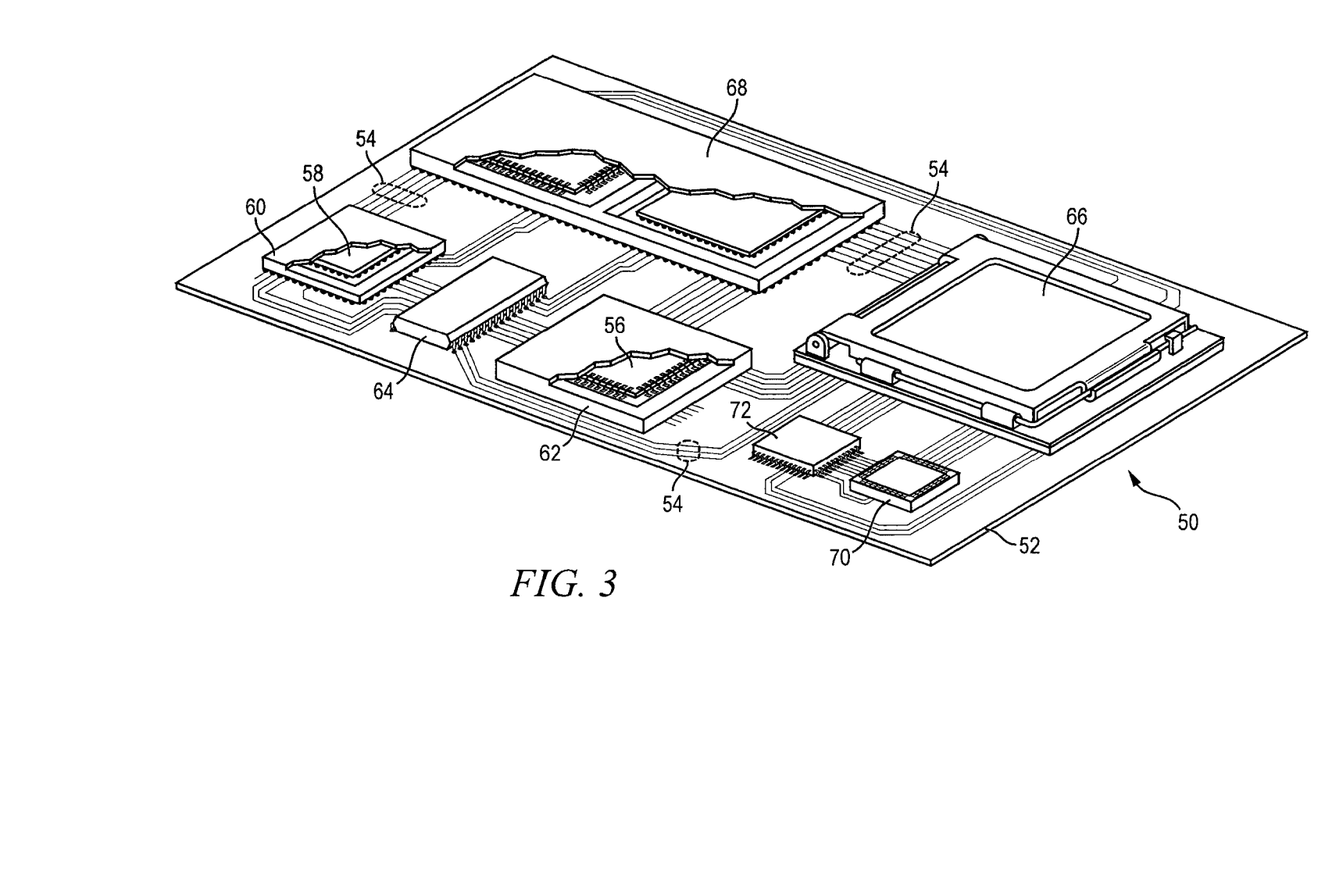
FIG. 3 illustrates a PCB with different types of packages mounted to its surface.

FIG. 3 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 3 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
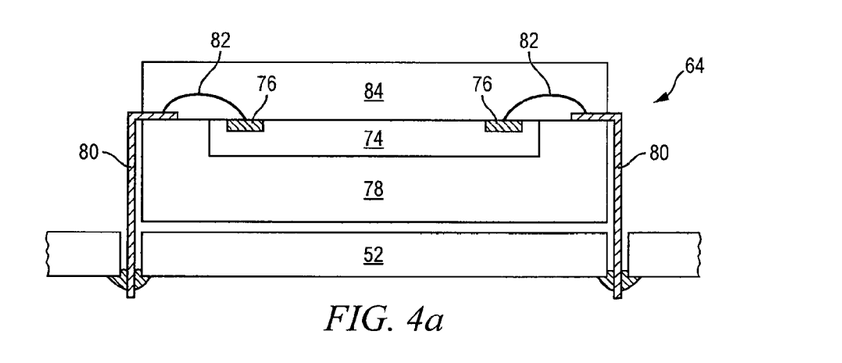
FIGS. 4a-4c illustrate further detail of the representative semiconductor packages mounted to the PCB.

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 4B:
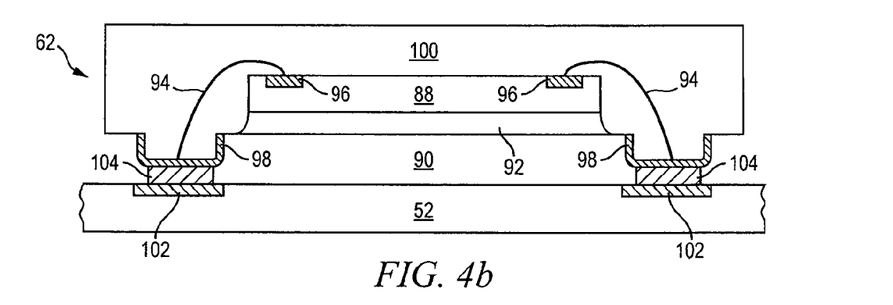

FIG. 4b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 4C:
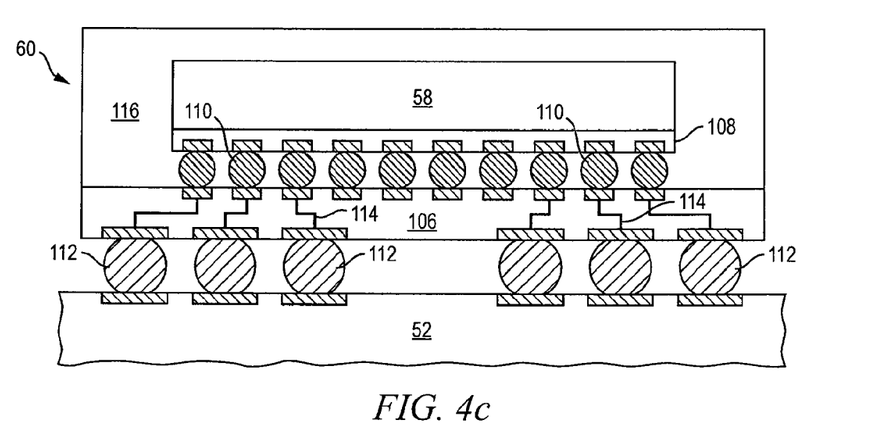

In FIG. 4c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 5A:
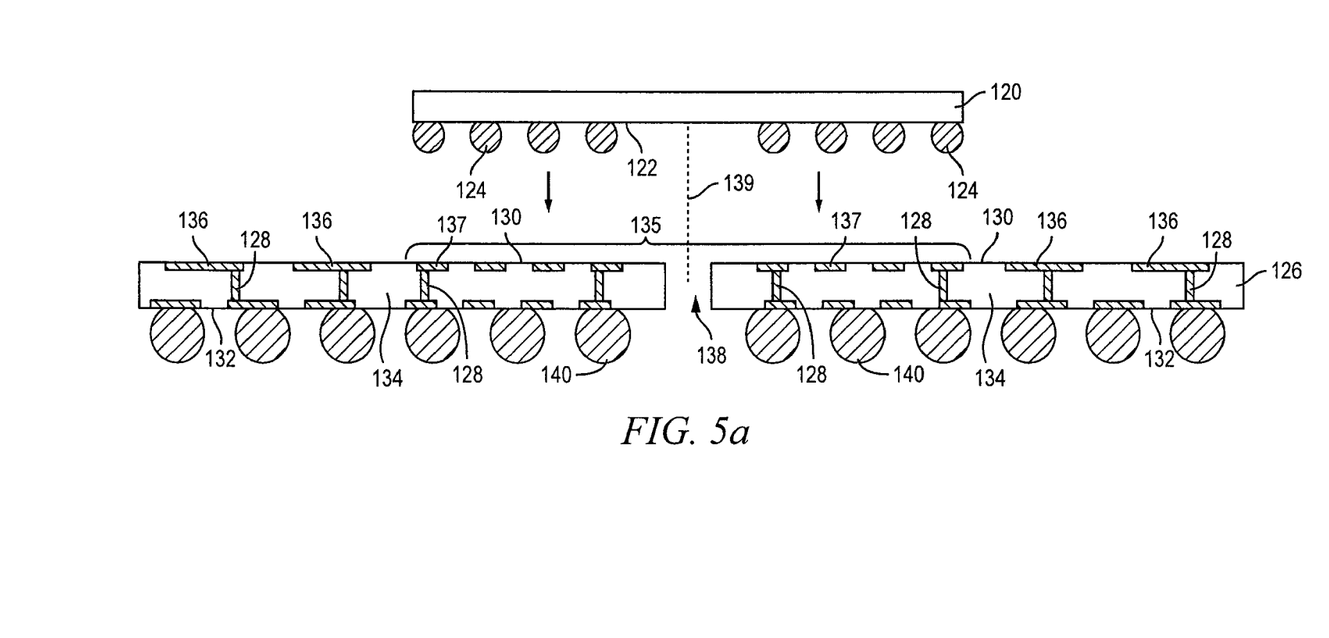
FIGS. 5a-5k illustrate a process of forming a perforated opening in the bottom substrate of a flipchip PoP assembly to control dispensing of underfill material.

FIGS. 5a-5k illustrate, in relation to FIGS. 3 and 4a-4c, a process of dispensing underfill material through a perforated opening in the bottom substrate of a flipchip PoP assembly to control bleeding of the underfill material. FIG. 5a shows a flipchip type semiconductor die 120 having an active surface 122 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 122 to implement analog circuits or digital circuits, such as digital signal processor (DSP), ASIC, memory, or other signal processing circuit. Semiconductor die 120 may also contain IPDs, such as inductors, capacitors, and resistors, for RF signal processing. A plurality of bumps 124 is formed over active surface 122 for electrical interconnect.

A substrate 126 includes electrically conductive layers or traces 128 formed in the substrate to provide electrical interconnect according to the electrical design and function of semiconductor die 120. The conductive layers and traces 128 extend across substrate 126 and through the substrate between top surface 130 and opposing bottom surface 132 with electrical separation by insulating layer 134. A plurality of contact pads 136 is formed over top surface 130 of substrate 126 outside a die attach area 135 or footprint of semiconductor die 120. A plurality of contact pads 137 is formed over top surface 130 of substrate 126 within die attach area 135. A perforated opening 138 is formed through substrate 126 at a location corresponding to line 139, which is the center of placement of semiconductor die 120 with respect to substrate 126 within die attach area 135. The perforated opening 138 extends from top surface 130 to bottom surface 132. A plurality of bumps 140 is formed over bottom surface 132 for electrical interconnect.

Figure 5B:
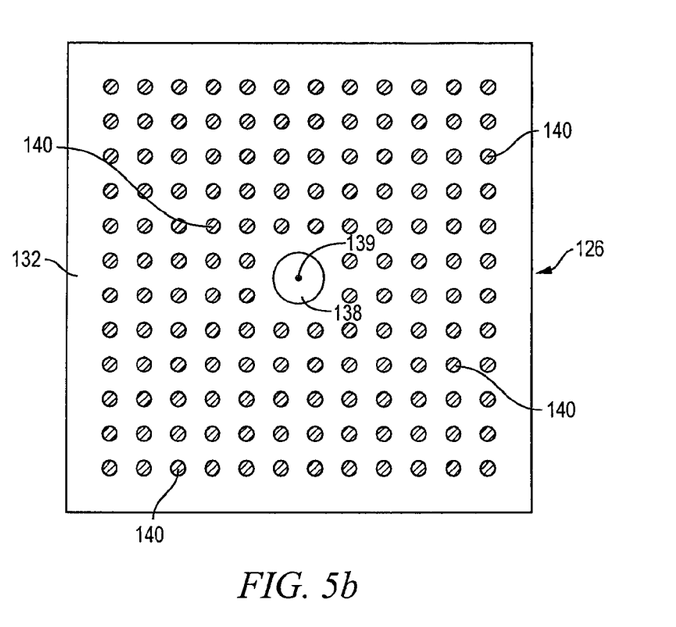
Figure 5C:
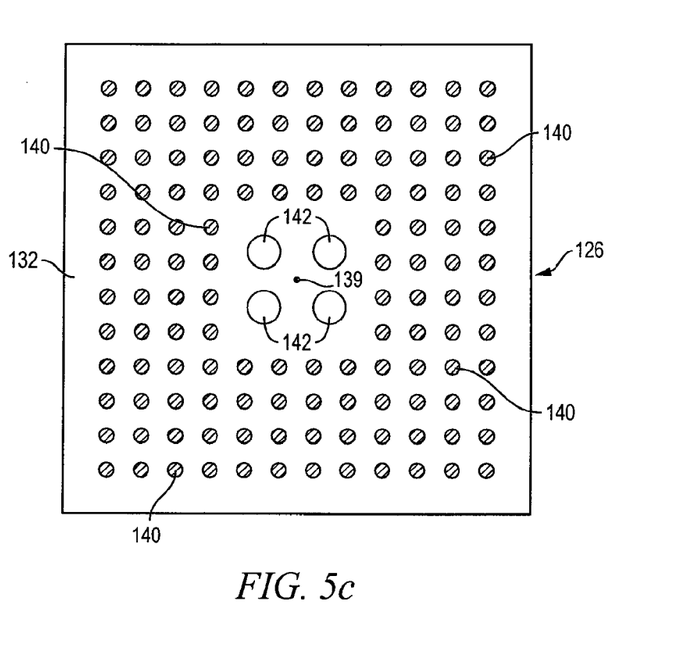

FIG. 5b shows a view of bottom surface 132 of substrate 126 with perforated opening 138 and bumps 140. The perforated opening 138 is located at line 139 which is central to placement of semiconductor die 120 over substrate 126. FIG. 5c shows an alternate embodiment of bottom surface 132 with a plurality of perforated openings 142 and bumps 140. The perforated openings 142 are uniformed distributed around the central placement of semiconductor die 120 over substrate 126.

Figure 5D:
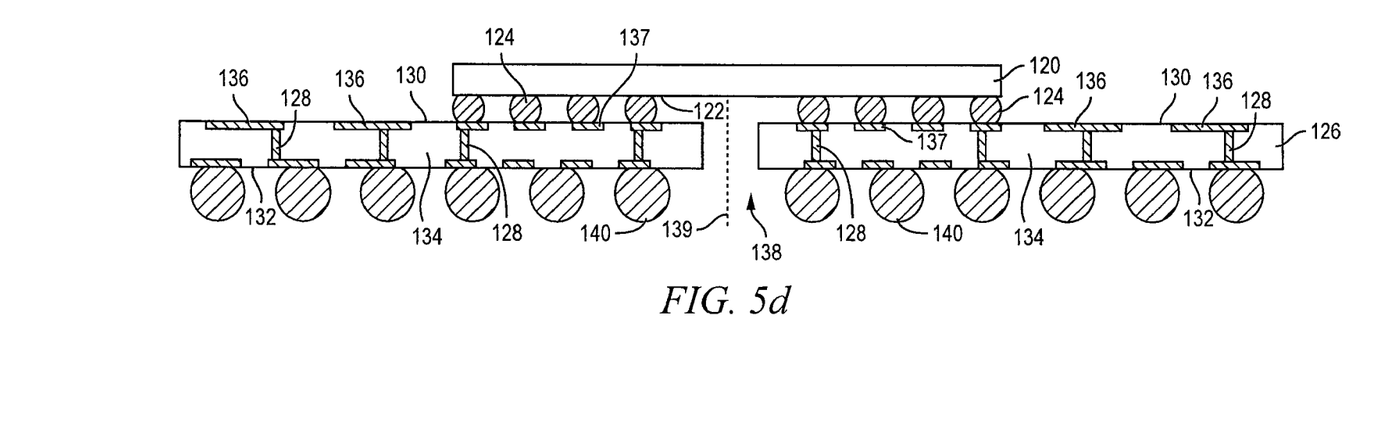

In FIG. 5d, semiconductor die 120 is mounted to substrate 126 by reflowing bumps 124 to metallurgically and electrically connect the bumps to contact pads 137.

Figure 5E:
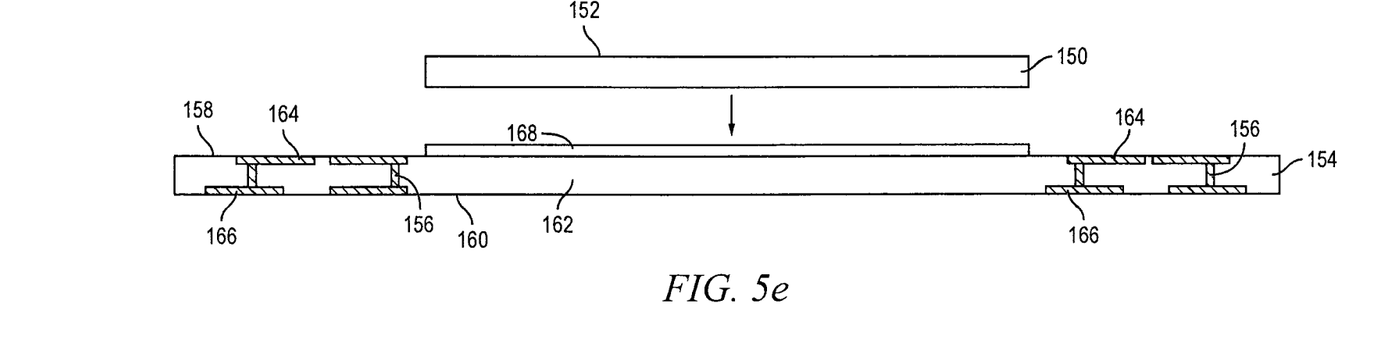

FIG. 5e shows a semiconductor die 150 having an active surface 152 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 152 to implement analog circuits or digital circuits, such as DSP, ASIC, memory, or other signal processing circuit. Semiconductor die 150 may also contain IPDs, such as inductors, capacitors, and resistors, for RF signal processing.

Figure 5F:
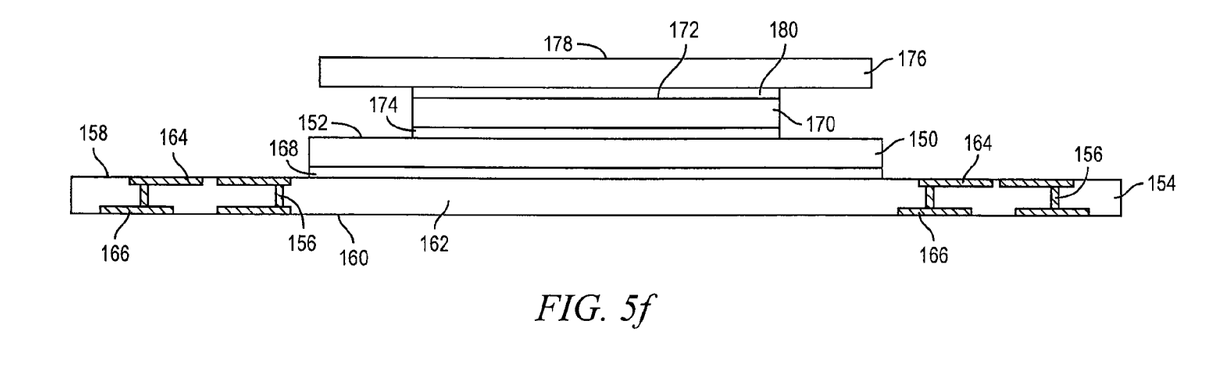

A substrate 154 includes electrically conductive layers or traces 156 formed in the substrate to provide electrical interconnect according to the electrical design and function of semiconductor die 150. The conductive layers and traces 156 extend across substrate 154 and through the substrate between top surface 158 and bottom surface 160 with electrical separation by insulating layer 162. A plurality of contact pads 164 is formed over top surface 158 of substrate 154 outside the placement of semiconductor die 150. A plurality of contact pads 166 is formed over bottom surface 160 of substrate 154. Semiconductor die 150 is mounted to substrate 154 with die attach adhesive 168, as shown in FIG. 5f.

A semiconductor die 170 has an active surface 172 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 172 to implement analog circuits or digital circuits, such as DSP, ASIC, memory, or other signal processing circuit. Semiconductor die 170 may also contain IPDs, such as inductors, capacitors, and resistors, for RF signal processing. Semiconductor die 170 is mounted to semiconductor die 150 with die attach adhesive 174.

A semiconductor die 176 has an active surface 178 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 178 to implement analog circuits or digital circuits, such as DSP, ASIC, memory, or other signal processing circuit. Semiconductor die 176 may also contain IPDs, such as inductors, capacitors, and resistors, for RF signal processing. Semiconductor die 176 is mounted to semiconductor die 170 with die attach adhesive 180. Stacked semiconductor die 150, 170, and 176 may have similar footprints, or different footprints as shown in FIG. 5f.

Figure 5G:
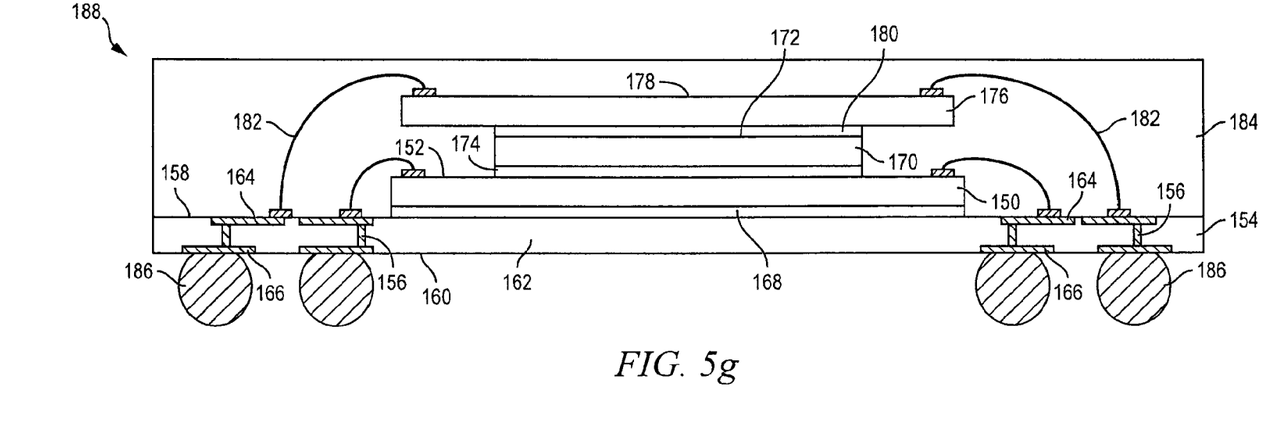

In FIG. 5g, semiconductor die 150, 170, and 176 are electrically connected to contact pads 164 of substrate 154 with bond wires 182. An encapsulant 184 is deposited over semiconductor die 150, 170, 176 and substrate 154 using a paste printing, compressive molding, transfer molding, liquid encapsulant molding, vacuum lamination, spin coating, or other suitable applicator. Encapsulant 184 can be polymer composite material, such as epoxy resin with filler, epoxy acrylate with filler, or polymer with proper filler. Encapsulant 184 is non-conductive and environmentally protects the semiconductor device from external elements and contaminants. A plurality of bumps 186 is formed over contact pads 166 of substrate 154 for electrical interconnect. Stacked semiconductor die 150, 170, and 176 mounted to substrate 154 constitute a PoP semiconductor assembly 188.

Figure 5H:
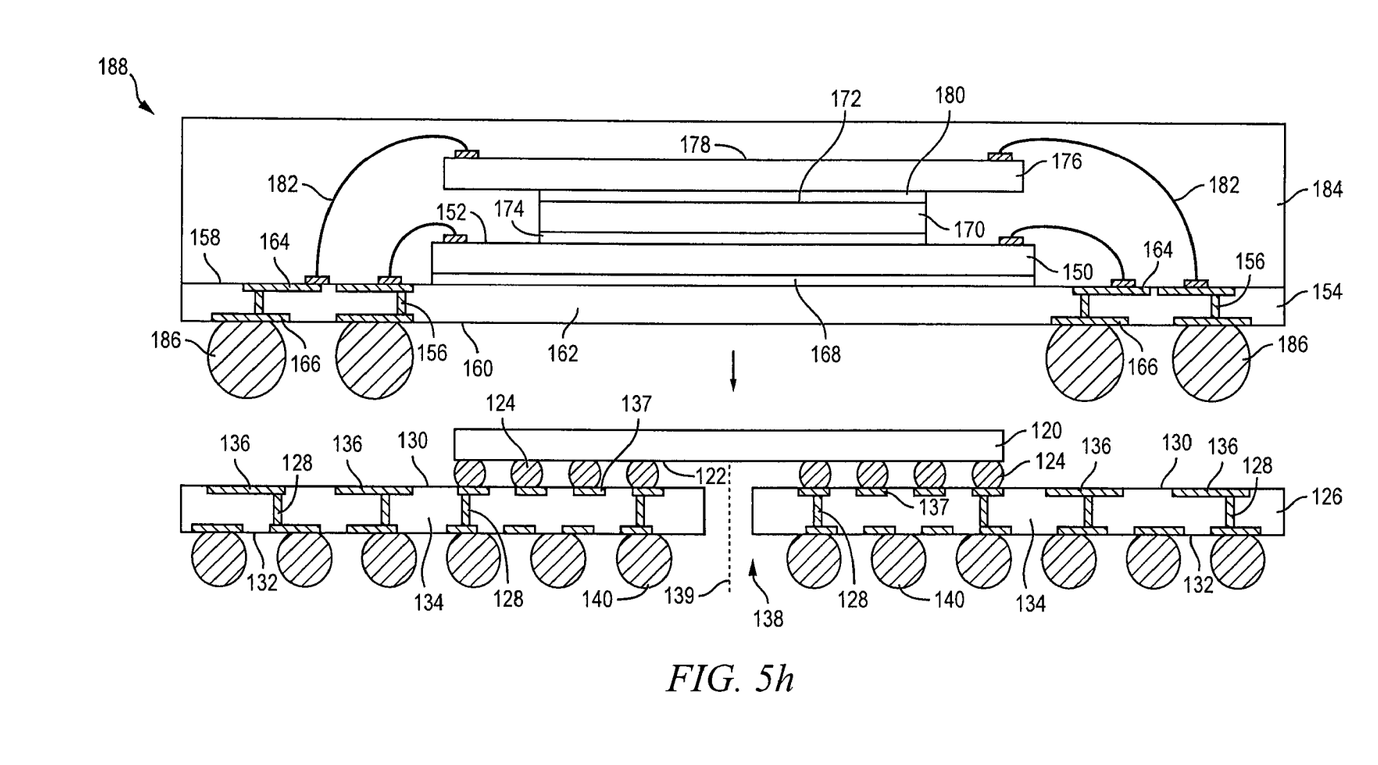
Figure 5I:
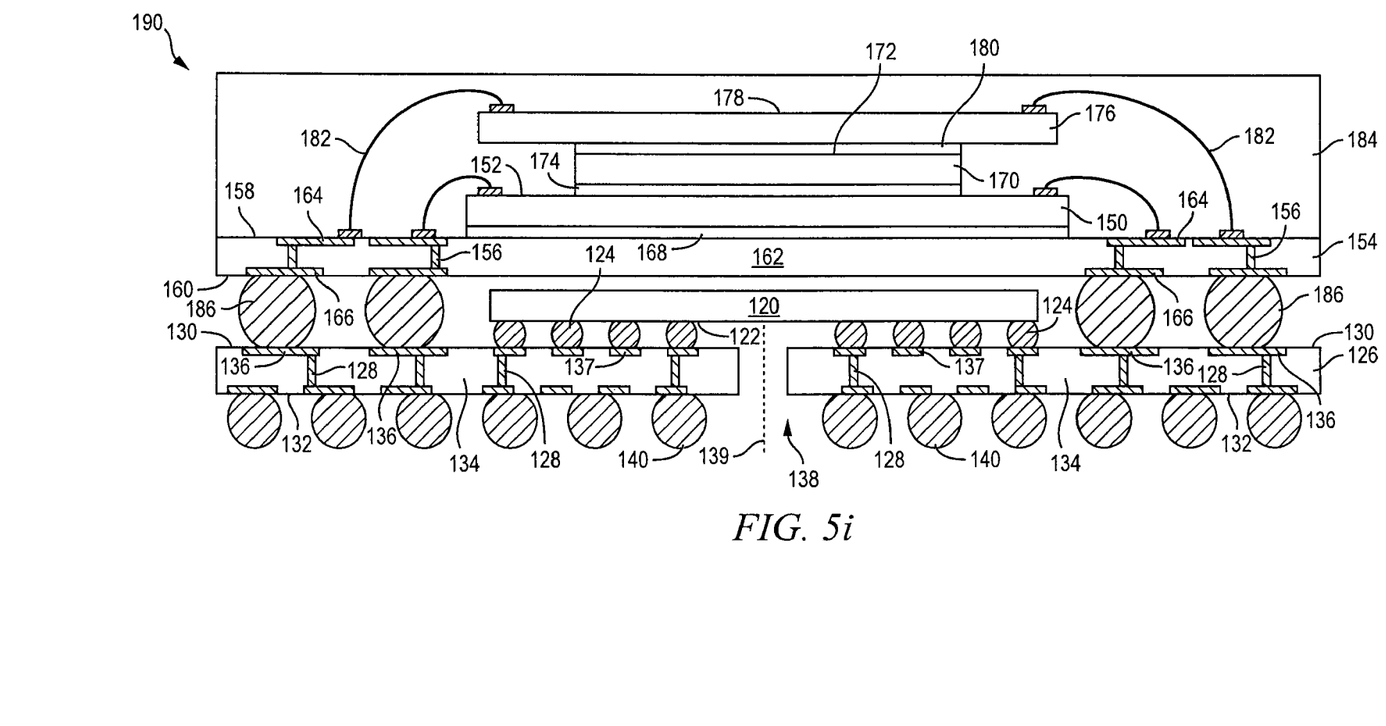
Figure 5J:
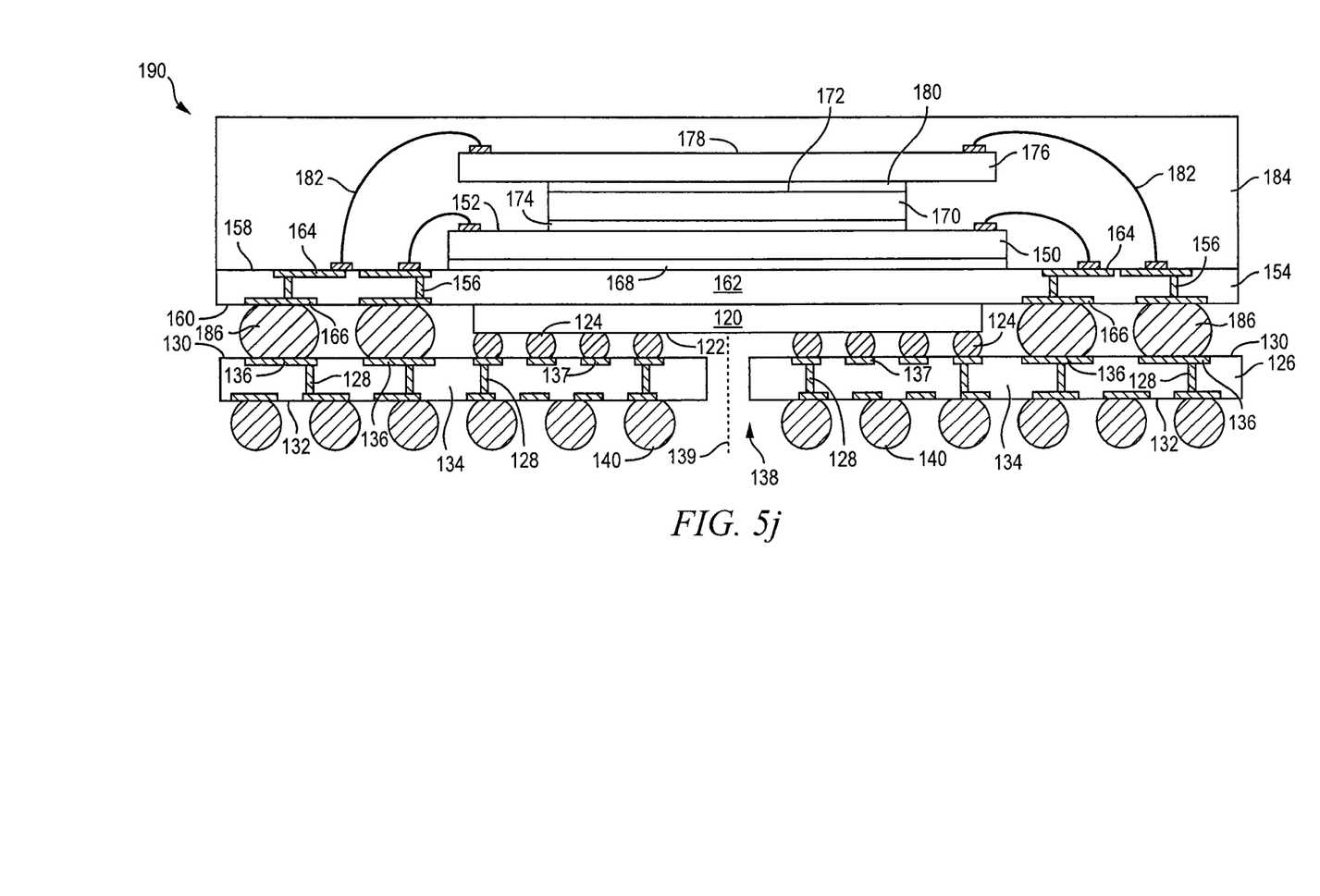

In FIGS. 5h and 5i, the PoP semiconductor assembly 188 is mounted to substrate 126 by reflowing bumps 186 to form a metallurgical and electrical connection between the bumps and contact pads 136. The combination of PoP semiconductor assembly 188 and substrate 126 with semiconductor die 120 is designated flipchip PoP assembly 190. FIG. 5j shows bumps 186 reflowed a second time to improve electrical connection to contact pads 136.

Figure 5K:
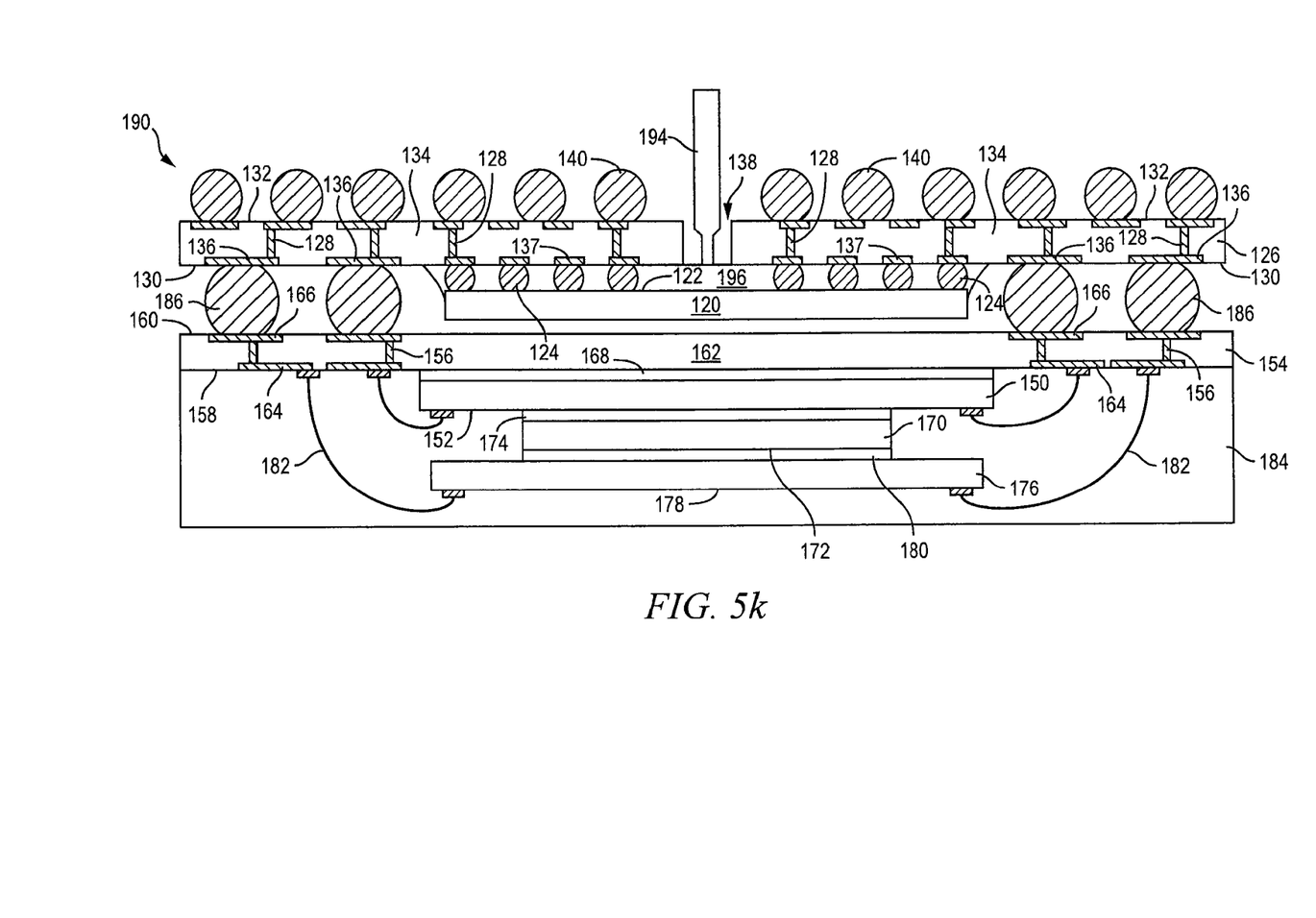

After the PoP semiconductor assembly 188 is mounted to substrate 126, the flipchip PoP assembly 190 is inverted with bottom surface 132 and bumps 140 oriented upward, as shown in FIG. 5k. A dispensing tool 194 dispenses underfill material 196, such as epoxy resin, from bottom surface 132 of substrate 126 through perforated opening 138 (or perforated openings 142) to the area between semiconductor die 120 and substrate 126. Because perforated opening 138 is located central with respect to semiconductor die 120, underfill material 196 is evenly and uniformly distributed from the central location of opening 138 to the perimeter of the die. The volume of underfill material 196 which is dispensed, as well as the distribution of the underfill material, can be controlled to minimize or eliminate bleeding and reduce void formation in the underfill material. The dispensing of underfill material 196 from dispensing tool 194 discontinues or ceases as the underfill material approaches or reaches the perimeter of semiconductor die 120.

Figure 6:
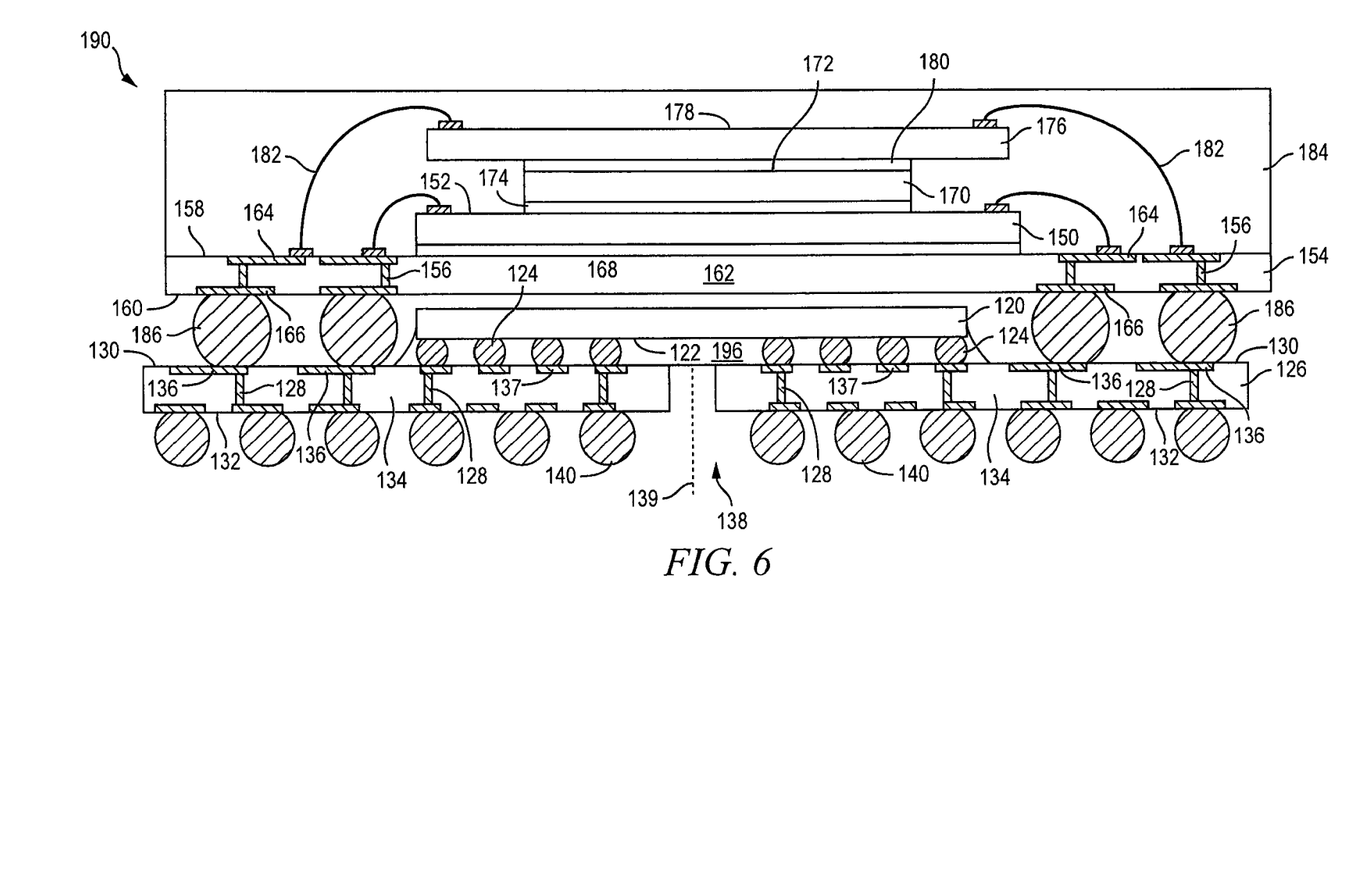
FIG. 6 illustrates the flipchip PoP assembly following cure of the underfill material.

FIG. 6 shows flipchip PoP package 190 following cure of underfill material 196 and electronic testing. Since underfill material 196 is dispensed from a location central to placement of semiconductor die 120 over substrate 126 outwardly to all sides of the die, the underfill material is evenly distributed between the die and substrate. The underfill material 196 should reach all sides around the perimeter of semiconductor die 120 simultaneously. No side of semiconductor die 120 will have a long filler width. By minimizing or eliminating underfill material bleed-out, electrical interconnect defects are reduced. The opening 138 also reduces internal stress and increases reliability. With less underfill bleeding, the I/O density and layout can be improved, i.e., contact pads 136 can be placed closer to the footprint of semiconductor die 120.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die and first substrate;
   forming an opening in the first substrate;
   disposing the first semiconductor die over the opening in the first substrate;
   disposing a second semiconductor die over a second substrate;
   disposing the second substrate over the first semiconductor die;
   forming an interconnect structure between the first substrate and a surface of the second substrate opposite the second semiconductor die to electrically connect the second substrate to the first substrate;
   dispensing a volume of underfill material through the opening in the first substrate between the first substrate and a surface of the first semiconductor die after disposing the second substrate over the first semiconductor die; and
   discontinuing the dispensing of the underfill material as the underfill material approaches a perimeter of the surface of the first semiconductor die.

2. The method of claim 1, further including locating the opening in the first substrate central to placement of the first semiconductor die with respect to the first substrate.

3. The method of claim 1, further including forming a plurality of openings in the first substrate uniformly distributed about a central placement of the first semiconductor die to the first substrate.

4. The method of claim 1, further including depositing an encapsulant over the second semiconductor die and second substrate.

5. The method of claim 1, wherein the interconnect structure includes a bump.

6. The method of claim 1, wherein the first semiconductor die includes a flipchip semiconductor die.

7. The method of claim 1, further including curing the underfill material.

8. A method of making a semiconductor device, comprising:
   providing a semiconductor die and substrate;
   forming an opening in the substrate;
   disposing the semiconductor die over the opening in the substrate;
   providing a package-on-package (PoP) semiconductor assembly;
   disposing the PoP semiconductor assembly over the substrate and semiconductor die;
   dispensing an underfill material through the opening in the substrate between the semiconductor die and substrate after disposing the PoP semiconductor assembly over the substrate and semiconductor die; and
   discontinuing dispensing of the underfill material as the underfill material approaches a perimeter of the semiconductor die.

9. The method of claim 8, further including locating the opening in the substrate central to placement of the semiconductor die with respect to the substrate.

10. The method of claim 8, further including forming a plurality of openings in the substrate uniformly distributed about a central placement of the semiconductor die with respect to the substrate.

11. The method of claim 8, further including:
    forming a plurality of bumps over a surface of the substrate; and
    reflowing the bumps to mount the PoP semiconductor assembly to the substrate.

12. The method of claim 8, wherein the semiconductor die includes a flipchip semiconductor die.

13. The method of claim 8, further including curing the underfill material.

14. The method of claim 8, further including disposing the PoP semiconductor assembly in contact with the semiconductor die.

* * * * *